United States Patent
Honda et al.

(10) Patent No.: US 7,578,681 B2
(45) Date of Patent: Aug. 25, 2009

(54) ELECTRONIC DEVICE INCLUDING PRINTED CIRCUIT BOARD AND ELECTRONIC ELEMENT MOUNTED ON THE PRINTED CIRCUIT BOARD

(75) Inventors: Takayoshi Honda, Nagoya (JP); Minoru Hozuka, Okazaki (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/222,321

(22) Filed: Aug. 7, 2008

(65) Prior Publication Data

US 2009/0068864 A1 Mar. 12, 2009

(30) Foreign Application Priority Data

Sep. 10, 2007 (JP) .............................. 2007-234549

(51) Int. Cl.
*H01R 12/00* (2006.01)
*H05K 1/00* (2006.01)
(52) U.S. Cl. ....................................................... 439/83
(58) Field of Classification Search .................. 439/83, 439/79, 82
See application file for complete search history.

(56) References Cited

U.S. PATENT DOCUMENTS

| | | | | |
|---|---|---|---|---|
| 5,451,158 A | * | 9/1995 | Lin et al. | 439/79 |
| 5,647,749 A | * | 7/1997 | Atoh et al. | 439/79 |
| 6,081,998 A | * | 7/2000 | Terauchi et al. | 29/845 |
| 6,655,990 B2 | * | 12/2003 | Terauchi et al. | 439/567 |
| 7,192,313 B2 | * | 3/2007 | Sai | 439/660 |
| 7,207,809 B2 | * | 4/2007 | Sasaki et al. | 439/79 |
| 7,341,462 B2 | * | 3/2008 | Matsuoka et al. | 439/79 |
| 7,367,818 B2 | * | 5/2008 | Sakamoto | 439/79 |
| 7,400,511 B2 | | 7/2008 | Ito et al. | |
| 2007/0193774 A1 | * | 8/2007 | Ito et al. | 174/260 |
| 2008/0144260 A1 | * | 6/2008 | Honda | 361/679 |
| 2008/0146051 A1 | * | 6/2008 | Honda | 439/66 |
| 2009/0068862 A1 | * | 3/2009 | Honda | 439/78 |

FOREIGN PATENT DOCUMENTS

JP 11-317265 A 11/1999
JP 2002-246721 A 8/2002

OTHER PUBLICATIONS

U.S. Appl. No. 12/222,327, filed Aug. 7, 2008, Honda et al.
U.S. Appl. No. 11/979,968, filed Nov. 13, 2007, Honda.
U.S. Appl. No. 11/979,972, filed Nov. 13, 2007, Honda.

* cited by examiner

*Primary Examiner*—Javaid Nasri
(74) *Attorney, Agent, or Firm*—Posz Law Group, PLC

(57) ABSTRACT

An electronic device includes a printed circuit board and an electronic element having a terminal. The terminal has a surface section and an insertion section. The printed circuit board includes a through hole extending from a first surface to a second surface of the printed circuit board, a surface land disposed on the first surface, and an insertion land integrally disposed on a sidewall of the through hole and on a periphery around the through hole. The surface section is coupled with the surface land through a solder. The insertion section is disposed in the through hole and is coupled with the insertion land through the solder. The surface section has a recess part and a portion of recess part is disposed so as to be axially aligned with a portion of the through hole.

15 Claims, 8 Drawing Sheets

ELECTRONIC DEVICE INCLUDING PRINTED CIRCUIT BOARD AND ELECTRONIC ELEMENT MOUNTED ON THE PRINTED CIRCUIT BOARD

CROSS REFERENCE TO RELATED APPLICATIONS

The present application is based on and claims priority to Japanese Patent Application No. 2007-234549 filed on Sep. 10, 2007, the contents of which are incorporated in their entirety herein by reference.

BACKGROUND OF THE INVENTION

1. Field of the Invention

The present invention relates to an electronic device that includes a printed circuit board and an electronic element mounted on the printed circuit board.

2. Description of the Related Art

According to the prior art, an electronic device that includes a printed circuit board and an electronic element mounted on the printed circuit board has an insertion mounting structure and a surface mounting structure.

For example, in an electronic device disclosed in JP-A-11-317265, end portions of leads (i.e., branch terminals) of an electronic element (i.e., a connector) are formed by punching to have inverted L-shapes. Each of the branch terminals has a horizontal portion (i.e., surface section) and a vertical portion (i.e., insertion section) that are integrally formed. The surface section is joined to a surface of a lead-connecting land (i.e., surface land). The insertion-section is inserted into a through hole provided at a printed wiring board.

When the insertion section is inserted into the through hole in which a solder paste is applied, air may be caught in the solder paste. In addition, a flux and a solvent component in the solder paste are gasified in the solder paste at a reflow process. The bubbles of air and gas move in the melted solder paste (i.e., in the through hole) toward an upper surface of the printed circuit board on which the electronic element is disposed.

When the electronic element has the branch terminals, the surface sections of the branch terminals are located on the upper-surface side of the printed circuit board, which is the same side as the bubbles move to. The surface sections are located over at least portions of the through holes and the surface lands. In addition, in a thickness direction of the printed circuit board, lower surfaces of the surface sections are same height as upper surfaces of the surface lands or the lower surfaces of the surface sections are slightly away from the upper surfaces of the surface lands. Thus, even if the bubbles move upward and contact the surface sections, and then move in a direction perpendicular to the through holes (i.e., horizontal direction), sidewalls of the through holes are located in the moving direction. Thereby, the surface sections of the branch terminals restrict the movement of the bubbles. If a part of the bubbles remains in the solder paste, a void may be generated when the solder pasted is cooled and solidified. As a result, the branch terminals are difficult to be coupled with the printed circuit board with a high degree of certainty.

SUMMARY OF THE INVENTION

In view of the foregoing problems, it is an object of the present invention to provide an electronic device that includes a printed circuit board and an electronic element coupled with the printed circuit board with a high degree of certainty.

According to an aspect of the invention, an electronic device includes a printed circuit board and an electronic element. The printed circuit board has a first surface and a second surface and includes a plurality of lands. The electronic element has a body and a plurality of terminals extending from the body. The electronic element is disposed on the first surface of the printed circuit board in such a manner that terminals are arranged on the first surface in a predetermined direction. The terminals are coupled with the lands respectively. The printed circuit board further has a through hole extending from the first surface to the second surface. One of the lands includes a surface land disposed on the first surface of the printed circuit board and an insertion land integrally disposed on a sidewall of the through hole and on a periphery around the through hole. One of the terminals includes a surface section and an insertion section. The surface section is disposed on the surface land in such a manner that an attaching surface of the surface section faces the surface land, and the surface section is coupled with the surface land through the solder. The insertion section is disposed in the through hole and is coupled with the insertion land through the solder. The surface section has a recess part on the attaching-surface side and a portion of recess part is disposed so as to be axially aligned with a portion of the through hole.

In the present electronic device, bubbles of air and gas can be effectively released to an outside of solder through the recess part at a reflow process. Thus, the number of void can be reduced, and a connectivity of the electronic element with the printed circuit board can be improved.

According to another aspect of the invention, an electronic device includes a printed circuit board and an electronic element. The printed circuit board has a first surface and a second surface and includes a plurality of lands. The electronic element has a body and a plurality of terminals extending from the body. The electronic element is disposed on the first surface of the printed circuit board in such a manner that terminals are arranged on the first surface in a predetermined direction. The terminals are coupled with the lands respectively. The printed circuit board further has a through hole extending from the first surface to the second surface. One of the lands includes a surface land disposed on the first surface of the printed circuit board and an insertion land integrally disposed on a sidewall of the through hole and on a periphery around the through hole. One of the terminals includes a surface section and an insertion section. The surface section is disposed on the surface land in such a manner that an attaching surface of the surface section faces the surface land, and the surface section is coupled with the surface land through a solder. The insertion section is disposed in the through hole and is coupled with the insertion land through the solder. The surface section has an exhaust hole extending from the attaching surface to another surface of the surface section. An opening part of the exhaust hole on the attaching-surface side is provided in such a manner that a portion of the opening part is axially aligned with a portion of the through hole.

In the present electronic device, bubbles of air and gas can be effectively released to an outside of the solder through the exhaust hole at a reflow process. Thus, the number of void can be reduced, and a connectivity of the electronic element with the printed circuit board can be improved.

BRIEF DESCRIPTION OF THE DRAWINGS

Additional objects and advantages of the present invention will be more readily apparent from the following detailed description of exemplary embodiments when taken together with the accompanying drawings. In the drawings.

DETAILED DESCRIPTION OF THE EXEMPLARY EMBODIMENTS

In each following embodiment, a connector is shown as an example of an electronic element having branch terminals. In addition, an electronic control device that includes a printed circuit board on which the connector is mounted is shown as an example of an electronic device that includes a printed circuit board on which the electronic element is mounted.

First Embodiment

An electronic control device according to a first embodiment of the invention will be described with reference to FIGS. 1-9. The electronic control device 100 has a waterproof structure and can be suitably used as an electronic control unit disposed outside of a vehicle compartment. For example, the electronic control device 100 can be used as an engine control unit (engine ECU) disposed in an engine room. The electronic control device 100 has a part in common with an electronic device disclosed in U.S. patent application Ser. No. 11/979, 968 (corresponding to Japanese patent application No. 2007-148613) by one of the inventors. The other part that is characteristic of the electronic control device 100 of the present embodiment will be mainly described.

Figure 1:
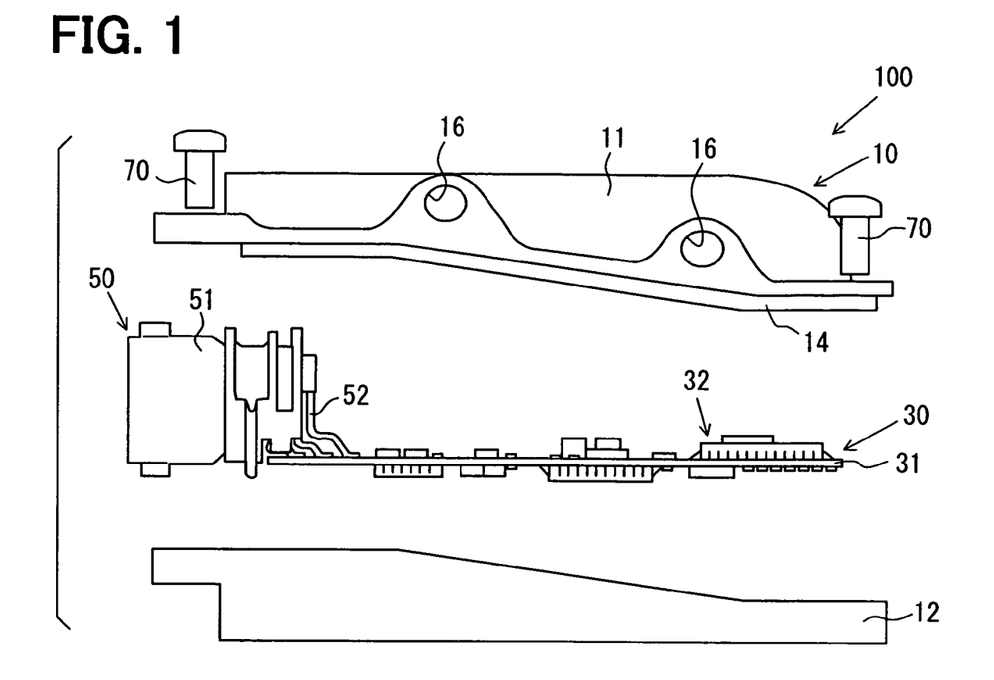
FIG. 1 is an exploded view illustrating an electronic control device according to a first embodiment.
Figure 2:
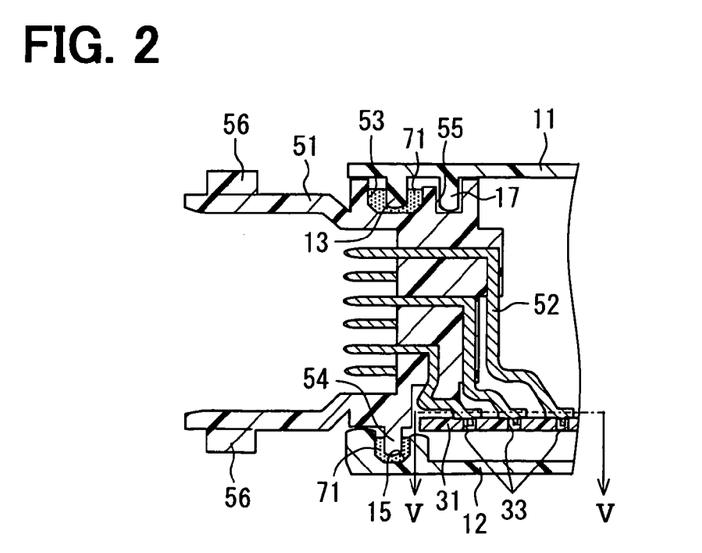
FIG. 2 is an enlarged cross-sectional view illustrating a coupling portion of a connector with a printed circuit board.

The electronic control device 100 includes a circuit board 30, a connector 50, and a casing 10. The circuit board 30 includes a printed circuit board 31 and electronic elements 32 mounted on the printed circuit board 31. The connector 50 includes a housing 51 and a plurality of terminals 52 extending from the housing 51.

The casing 10 may be made of metal, for example, aluminum or iron, or synthetic resin. The casing 10 houses the circuit board 30 and a portion of the connector 50. The casing 10 may be constructed with one component or a plurality of components.

For example, the casing 10 includes an upper case 11 and a lower case 12. The upper case 11 has a box shape in which a lower side is opened. The lower case 12 has an approximately rectangular plate shape having a shallow bottom. The upper case 11 and the lower case 12 are attached to each other in such a manner that the lower case 12 covers the lower side of the upper case 11. For example, the upper case 11 and the lower case 12 are fixed with a plurality of screws 70. The upper case 11 and the lower case 12 provide a space therebetween, and the circuit board 30 and the portion of the connector 50 are located in the space. The upper case 11 of the casing 10 has a cut portion (not shown) corresponding to the connector 50. The portion of the connector 50 is located in the space in the casing 10 and the other portion of the connector 50 protrudes to an outside of the casing 10.

The upper case 11 has a first holding portion 13 and a second holding portion 14 that protrude downward. The first holding portion 13 is formed to correspond to a first recess portion 53 provided on an outer surface of the housing 51. A portion of the first holding portion 13 is buried in a sealing member 71 disposed in the first recess portion 53. The second holding portion 14 is formed to correspond to a recess portion (not shown) provided in the lower case 12. A portion of the second holding portion 14 is buried in the sealing member 71 disposed in the recess portion of the lower case 12. In addition, the lower case 12 has another recess portion 15. At an outer surface of the housing 51, a holding portion 54 is provided. The holding portion 54 protrudes downward and a portion of the holding portion 54 is buried in the sealing member 71 disposed in the recess portion 15. Thereby, the space provided in the casing 10 becomes waterproof. The sealing member 71 may be made of a material having a high elastic modulus and a high adherence. The material further has a sealing effect so that a waterproof structure is provided between the connector 50 and the casing 10 in a state when the connector 50 is fit with an external connector. For example, the sealing member 71 is made of a moisture-curing silicone adhesive having a viscosity in a range from about 150 Pa·s to about 200 Pa·s before curing.

The upper case 11 has a plurality of attaching holes 16 for attaching the electronic control device 100 to the vehicle by using brackets. Furthermore, the upper case 11 has a protruding portion 17. At the outer surface of the housing 51, a second recess portion 55 is provided. The protruding portion 17 is fit into the second recess portion 55 for restricting a displacement of the casing 10 with respect to the connector 50 which is mounted on the circuit board 30. Thus, by fitting the protruding portion 17 into the second recess portion 55 of the housing 51, the connector 50 and the casing 10 are reduced from being gouged. In addition, the connector 50 has a plurality of protruding portions 56 so that the external connector can be fit with the connector 50.

The printed circuit board 31 includes wires and via holes for connecting the wires. The wires include lands functioning as electrodes. On the printed circuit board 31, the electronic elements 32 such as a microcomputer, a power transistor, a resistor, and a capacitor are mounted. As one of the electronic elements 32, the connector 50 is mounted on the printed circuit board 31 for electrically coupling the circuit board 30 and an external device.

Figure 6:
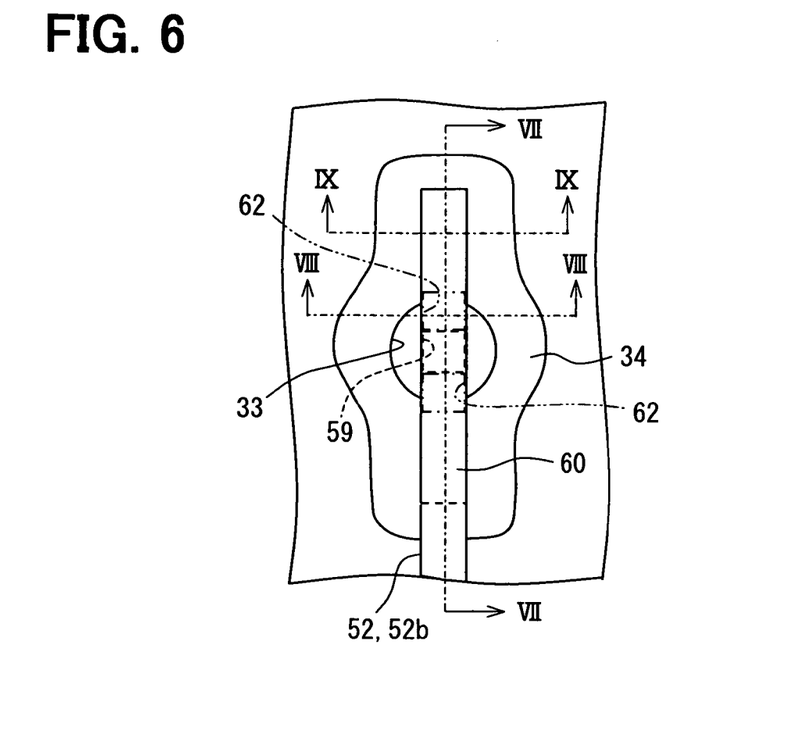
FIG. 6 is a plan view illustrating a coupling portion of a terminal and the printed circuit board.
Figure 7:
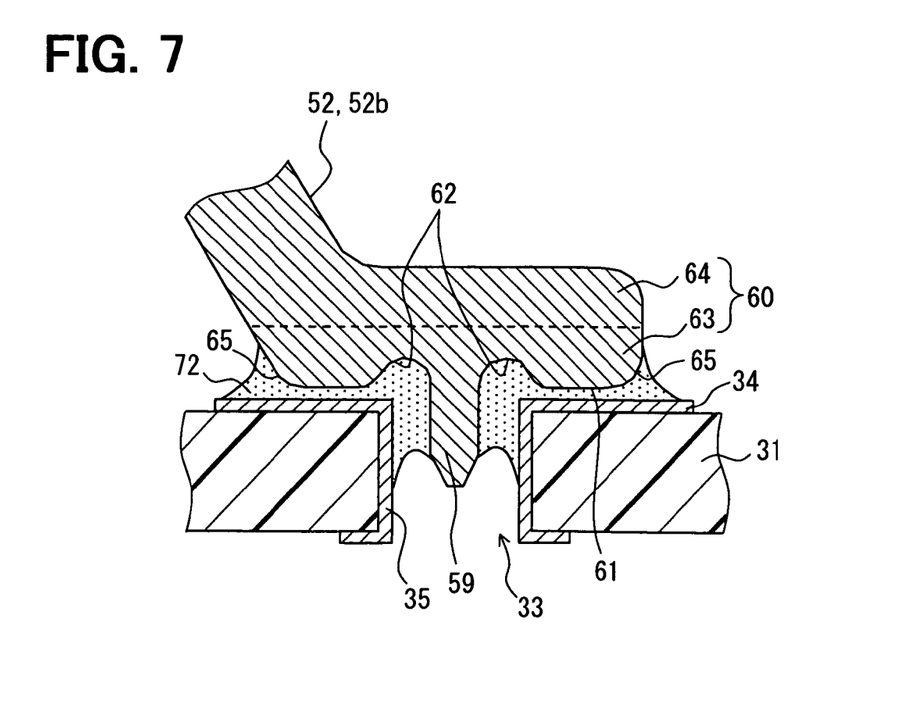
FIG. 7 is a cross-sectional view illustrating the coupling portion taken along line VII-VII in FIG. 6.
Figure 8:
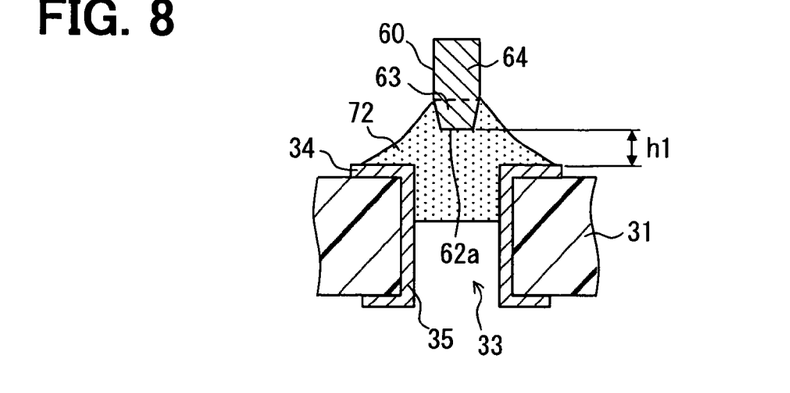
FIG. 8 is a cross-sectional view illustrating the coupling portion taken along line VIII-VIII in FIG. 6.

The printed circuit board 31 may be made of thermoplastic resin, thermosetting resin, ceramics, or a complex of glass (e.g., glass fabric) and resin, for example. The number of layer of the printed circuit board 31 is not limited. As illustrated in FIG. 2 and FIGS. 5-8, the printed circuit board 31 has a plurality of through holes 33 that extend from an upper surface to a lower surface of the printed circuit board 31. One end portions of the terminals 52 are respectively inserted into the through holes 33 from the upper surface of the printed circuit board 31. As illustrated in FIGS. 5-9, a plurality of surface lands 34 is provided on the upper surface of the printed circuit board 31. Thus surface lands 34 are disposed at peripheries around upper opening portions of the through holes 33 respectively. Furthermore, as illustrated in FIG. 7 and FIG. 8, a plurality of insertion lands 35 is integrally disposed on sidewalls of the through holes and on peripheries around lower opening portions of the through holes 33 respectively. The surface lands 34 and the insertion lands 35 are respectively coupled with the terminals 52 through a solder 72.

For example, the surface land 34 and the insertion land 35 coupled with the same terminal 52 are integrated at the upper surface of the printed circuit board 31, as illustrated in FIG. 7. As a matter of convenience, the whole of the lands located on the upper surface of the printed circuit board 31 is expressed as the surface land 34. As illustrated in FIG. 6 and FIG. 7, the surface land 34 has a pair of opposing portions. The opposing portions has the same dimension in a longitudinal direction of the surface land 34 and are provide on opposite sides of the through holes 33. In addition, in the surface land 34 and the insertion land 35 coupled with the same terminal 52, a portion located on the upper surface of the printed circuit board 31, i.e., the surface land 34, is larger than a portion located on the lower surface of the printed circuit board 31, i.e., a portion of the insertion land 35 at the periphery around the through hole 33.

Figure 3:
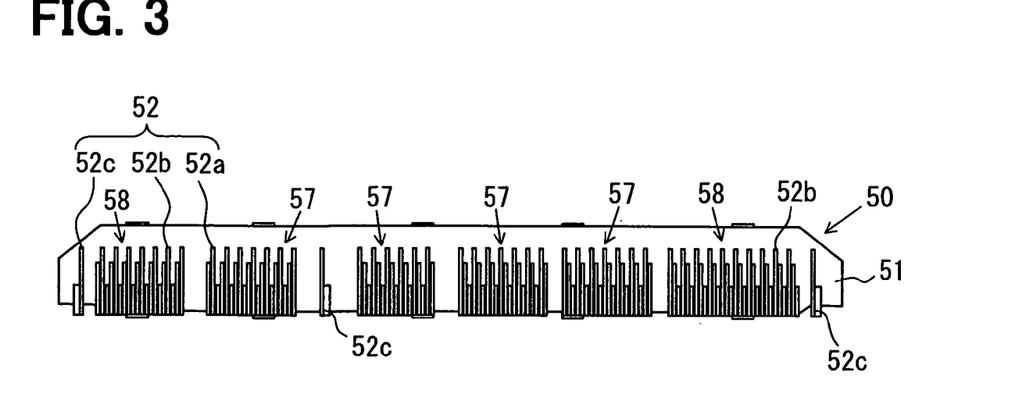
FIG. 3 is a plan view illustrating the connector viewed from a side where the printed circuit board is coupled.
Figure 5:
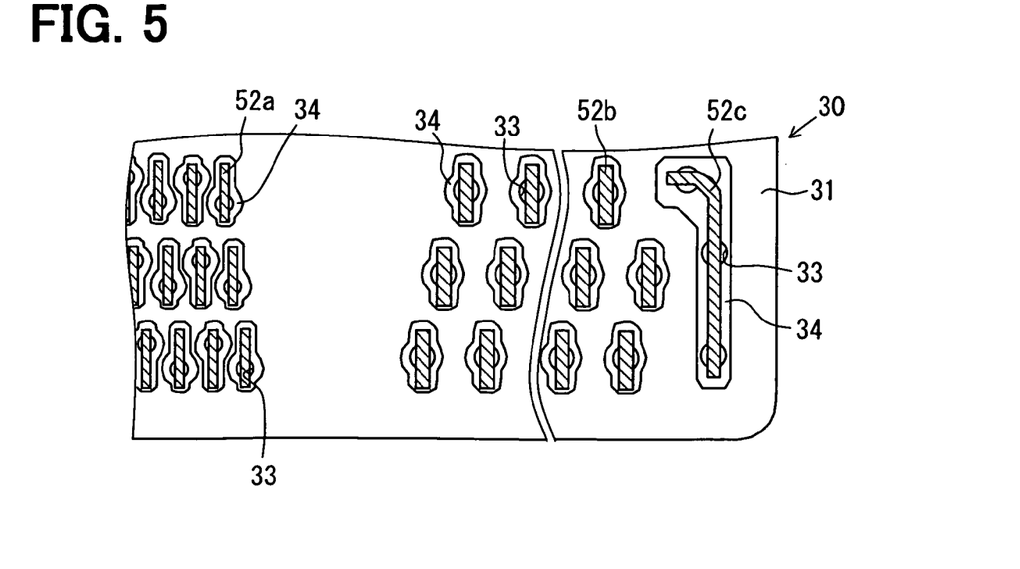
FIG. 5 is a cross-sectional view illustrating the coupling portion taken along line V-V in FIG. 2.

As illustrated in FIG. 5, the through holes 33 includes first through holes and the second through holes that are larger than the first through holes. The terminals 52 include a plurality of first terminals 52a, a plurality of second terminals 52b, and at least one third terminal 52c. For example, the terminals 52 include three third terminals 52c, as illustrated in FIG. 3. The first terminals 52a are thinner than the second terminals 52b and the third terminals 52c in an arranging direction of the terminals 52. The first terminals 52a are inserted into the first through holes. The second terminals 52b and the third terminals 52c are inserted into the second through holes. The surface lands 34 coupled with the first terminals 52a and the second terminals 52b are arranged in a three-row zigzag manner.

The connector 50 includes the housing 51 (i.e., body) made of an insulation material and the terminals 52 made of a conductive material. The one end portions of the terminals 52 extending from the housing 51 are mechanically and the electrically coupled with the surface lands 34 and the insertion lands 35 through the solder 72.

The other end portions of the terminals 52 extending from the housing 51 are exposed to an outside of the casing 10 to be coupled with the external connector. The first terminals 52a and the second terminals 52b have electric connect functions for coupling the printed circuit board 31 with the connector 50 electrically. In contrast, the third terminals 52c does not have the electric connect function for coupling the printed circuit board 31 with the connector 50 electrically. The third terminals 52c are provided for improving the connectivity of the connector 50 with the circuit board 30.

Figure 4:
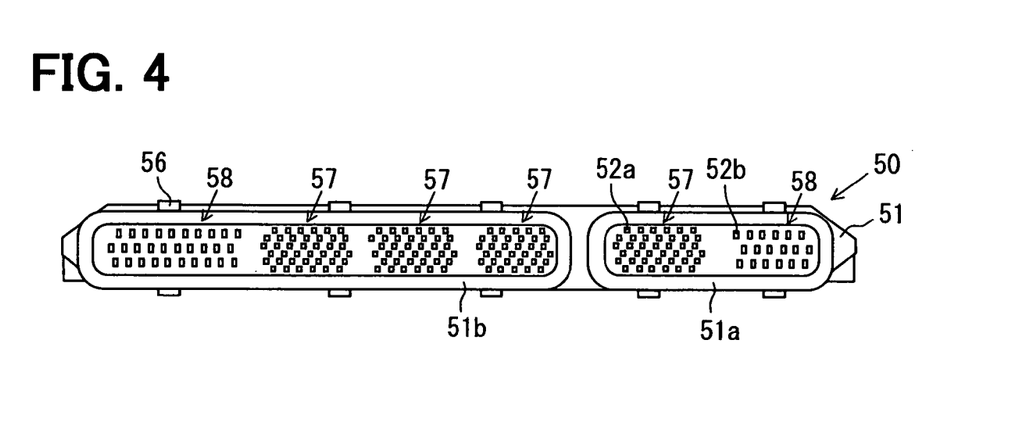
FIG. 4 is a plan view illustrating the connector viewed from a side where an external connector is coupled.

The terminals 52 are arranged in the housing 51 to be parallel to the upper surface of the printed circuit board 31. The first terminals 52a are signal terminals for transmitting signals. The second terminals 52b, which are thicker than the first terminals 52a, are power terminals for transmitting electricity. The second terminals 52b are electrically coupled with a power element. The first terminals 52a are arranged in six rows in a direction parallel to the upper surface of the printed circuit board 31. The second terminals 52c are arranged in three rows in a direction parallel to the upper surface of the printed circuit board 31. As illustrated in FIG. 3 and FIG. 4, the connector 50 has first terminal blocks 57 and second terminal blocks 58 arranged in a longitudinal direction of the housing 51. In the first terminal blocks 57, only the first terminals 52a are arranged. In the second terminal blocks 58, only the second terminals 52b are arranged. For example, in the longitudinal direction of the housing 51, four first terminal blocks 57 are arranged between two second terminal blocks 58. In addition, the connector 50 has a first connection port 51a and a second connection port 51b to be coupled with the external connector. One of the first terminal blocks 57 and one of the second terminal blocks 58 are arranged in the first connection port 51a, and three of the first terminal blocks 57 and one of the second terminal blocks 58 are arranged in the second connection port 51b.

The third terminals 52c are reinforcing terminals. Each third terminal 52c has only one end portion extending from the housing 51 and is coupled with the surface land 34 and the insertion land 35 of the printed circuit board 31. For example, in the longitudinal direction of the housing 51, two third terminals 52c are arranged outside of the second terminal blocks 58 respectively, and one third terminal 52c is arranged between the first connection port 51a and the second connection port 51b.

Each terminal 52 (52a-52c) has an insertion section 59 to be inserted into the through hole 33 and a surface section 60 to be disposed on the surface land 34. A structure of the second terminal 52b will now be described as a representative of the whole terminals 52. Hereafter, the second terminal 52 is called as the terminal 52. As illustrated in FIG. 6 and FIG. 7, the one end portion of the terminal 52 extending from the housing 51 has the insertion section 59 and the surface section 60. The insertion section 59 is inserted into the through hole 33 and is mechanically and electrically coupled with the insertion land 35 through the solder 72. The surface section 60 is disposed on the surface land 34 and is mechanically and electrically coupled with the surface land 34 through solder 72. Thus, the insertion section 59 of the insertion mounting structure and the surface section 60 of the surface mounting structure are integrated as one terminal.

When the terminal 52 is a branch terminal, the insertion section 59 has a positioning function in a direction perpendicular to the thickness direction of the printed circuit board 31 in a state when the insertion section 59 is inserted into the through hole 33. Thus, even if the printed circuit board 31 and/or housing 51 deforms at a reflow process due to a difference between the linear expansion coefficient of the printed circuit board 31 and the linear expansion coefficient of the housing 51, the connectivity of the terminal 52 with the surface land 34 and the insertion land 35 is ensured. In addition, the insertion section 59 is coupled with a portion of the insertion land 35 through the solder 72 in a state when an end of the insertion section 59 does not protrude from the through hole 33 to the second-surface side of the printed circuit board 31. Thus, even if the number of the terminals 52 arranged in the longitudinal direction of the housing 51 is large, a coplanarity of the surface section 60 and the corresponding surface land 34 is ensured. A contact area of the terminal 52 with the solder 72 and a contact area of the solder 72 with the surface land 34 and the insertion land 35 are larger than a predetermined area that is required for ensuring the connectivity of the terminal 52 with the surface land 34 and the insertion land 35. Thus, the connectivity of the connector 50 with the printed circuit board 31 can be improved. Furthermore, in the present case, all of the terminals 52 are configured as the branch terminals. Thus, the connectivity of the connector 50 with the printed circuit board 31 can be further improved.

The insertion section 59 extends from a lower surface 61 of the surface section 60 in a direction perpendicular to the upper surface of the printed circuit board 31. The insertion section 59 is located between the opposing portions of the surface land 34. The surface section 60 is arranged parallel to the upper surface of the printed circuit board 31. In the longitudinal direction of the surface section 60, the surface section 60 has a portion facing the surface land 34, a portion connected with the insertion section 59, and a portion facing the surface land 34 in order. That is, the one end portion of the terminal 52 has an substantially T-shape in which the insertion section 59 is located between the surface section 60. The surface section 60 has two recess parts 62, for example. The recess parts 62 are provided on the lower surface 61 of the surface section 60 that faces the upper surface of the printed circuit board 31. A portion of each recess part 62 is located over a portion of the through hole 33. That is, the portion of each recess part 62 is axially arranged with the portion of the through hole 33. The recess parts 62 are grooves extending to at least one edge of the lower surface 61 of the surface section 60.

Figure 9:
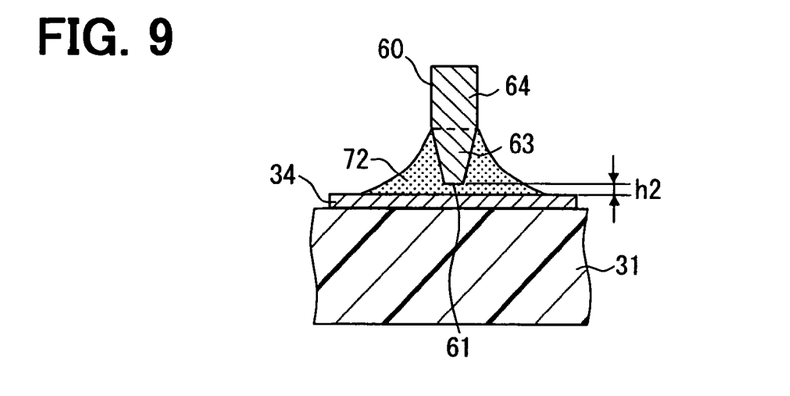
FIG. 9 is a cross-sectional view illustrating the coupling portion taken along line IX-IX in FIG. 6.

The lower surface 61 is substantially flat other than portions where the recess parts 62 are provided. As illustrated in FIG. 8 and FIG. 9, bottom surfaces 62a of the recess parts 62 are away from a surface of the surface land 34 at a distance h1 and a portion of the lower surface 61 other than the recess parts 62 is away from the surface of the surface land 34 at a distance h2 that is less than the distance h1. In the longitudinal direction of the surface section 60, each recess part 62 is provided from a portion of the lower surface 61 where the insertion section 59 branches off (i.e., branch portion) to a portion of the lower surface 61 located over the surface land 34. In the present case, two recess parts 62 are provided on opposite sides of the insertion section 59 to be adjacent to the insertion section 59. In addition, as illustrated in FIG. 6, the recess parts 62 extend from one edge to the other edge of the lower surface 61 in the arranging direction of the terminals 52, i.e., in a direction perpendicular to the longitudinal direction of the surface section 60.

As illustrated in FIG. 7, the bottom surfaces 62a of the recess parts 62 are rounded. Furthermore, as illustrate in FIGS. 7-9, the surface section 60 has a thin-wall region 63 and a thick-wall region 64. The thin-wall region 63 is a region from the lower surface 61 to a predetermined height and includes peripheries around the recess parts 62, i.e., a region lower than the dashed line in FIGS. 7-9. The thick-wall region 64 is a region other than the thin-wall region 63, i.e., a region higher than the dashed line. The thickness of the thick-wall region 64 is larger than the thickness of the thin-wall region 63 in the arranging direction of the terminals 52. In addition, the thin-wall region 63 has a taper shape in which the thickness of the thin-wall region 63 decreases toward the upper surface of the printed circuit board 31.

For example, the thickness of the insertion section 59 is less than the thick-wall region 64. As illustrated in FIG. 7, corner portions 65 between the lower surface 61 and side surfaces of the surface section 60 are rounded. Side fillets of the solder 72 are provided to the side surfaces including the corner portions 65.

Although the structure of the second terminal 52b is described above as a representative of the whole terminals 52, the first terminals 52a have similar structure. The third terminals 52c respectively have three insertion sections 59 and one surface section 60. Other part of the third terminals 52c is similar to the second terminals 52b. The branch terminals 52 may be punched terminals which is formed by punching a metal plate to have a predetermined shape having a bent portion and which is integrated with the housing 51 by insert molding. Alternatively, the branch terminals 52 may be bent terminals which is formed by punching a metal plate to have a rod shape and is bent after inserted into holes provided at the housing 51. For example, the terminals 52 are brass-plated punched terminals. The thin-wall region 63 is formed by pressing or hitting after the terminals 52 are punched. When the terminals 52 are the punched terminals, a recess-part forming process required for the bent terminals can be omitted. Thus, a production cost can be reduced.

Figure 10:
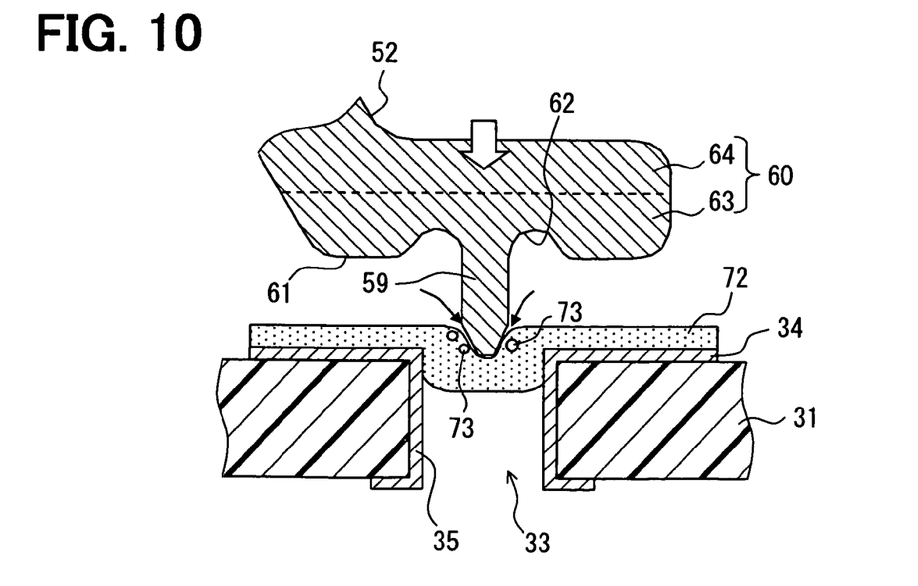
FIG. 10 is a cross-sectional view illustrating a process at which an insertion section of a terminal is inserted into a through hole.
Figure 11:
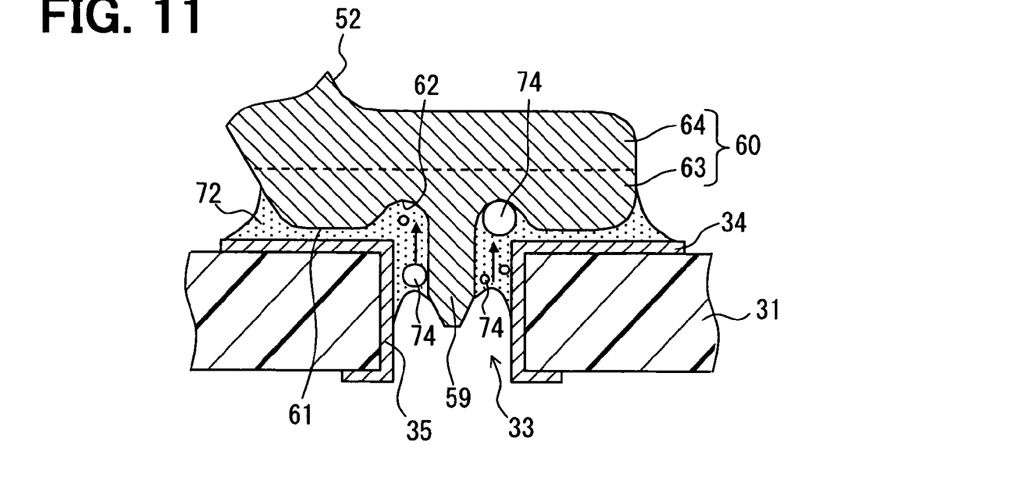
FIG. 11 is a cross-sectional view illustrating movements of bubbles at a reflow process.

A process of coupling the terminals 52 to the printed circuit board 31 will now be described. At first, the printed circuit board 31 having the through holes 33, the surface lands 34, and the insertion lands 35 is prepared. Then, the solder paste 72 is disposed on the surface lands 34 and in a portion of each through hole 33 from the upper-surface side of the printed circuit board 31, for example, by screen printing. The electronic elements 32 including the connector 50 are positioned on the upper surface of the printed circuit board 31. As illustrated in FIG. 10, when the insertion section 59 of the terminal 52 is inserted into the solder paste 72 disposed in the through hole 33, air 73 may be caught in the solder paste 72. In addition, when the printed circuit board 31 is treated with a reflow process in a state when the electronic elements 32 including the connector 50 are disposed, a flux and a solvent component in the solder paste 72 are gasified in the solder paste 72 by heating. Bubbles 74 of the air and the gas move upward in the melted solder 72 in the through hole 33 toward the upper-surface side of the printed circuit board 31, as illustrated in FIG. 11. The bubbles 74 are bonded to each other and diameters of the bubbles 74 increases.

Figure 12:
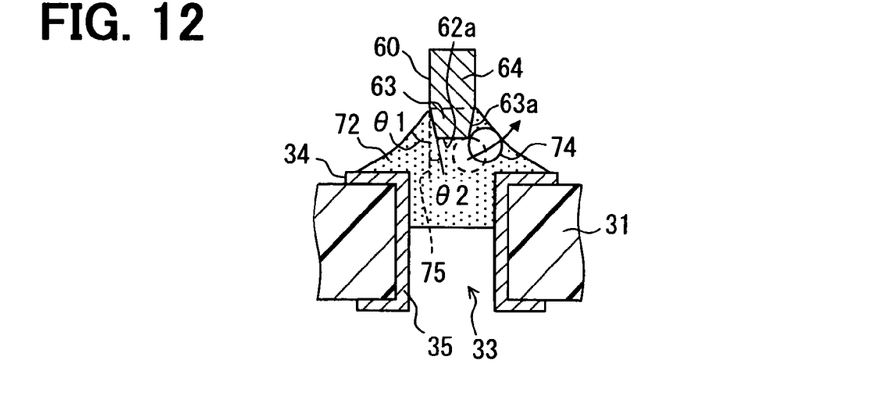
FIG. 12 is a cross-sectional view illustrating a movement of a bubble at the reflow process.

The recess parts 62 are provided at the lower surface 61 of the surface sections 60 in such a manner that at least a portion of each recess part 62 is located over a portion of the through hole 33. In addition, each recess part 62 extends to the edge of the lower surface 61. As described above, the distance h1 between the bottom surfaces 62a of the recess parts 62 and the surface of the surface land 34 is larger than the distance h2 between the portions of the surface section 60 other than the recess parts 62 and the surface of the surface land 34. That is, clearances between the bottom surfaces 62a of the recess parts 62 and the surface of the surface land 34 become large. Thus, as illustrated in FIG. 11 and FIG. 12, the maximum dimension of the bubbles that can be moved to the clearances provided over the surface land 34 increases depending on the dimensions of the clearances. The bubbles 74 can move along the recess parts 62 functioning as introducing passages in the direction perpendicular to the thickness direction of the printed circuit board 31, i.e., in the horizontal direction. Thereby, the bubbles 74 can be effectively released to an outside of the solder 72 without contacting the sidewall of the through hole 33.

Figure 13:
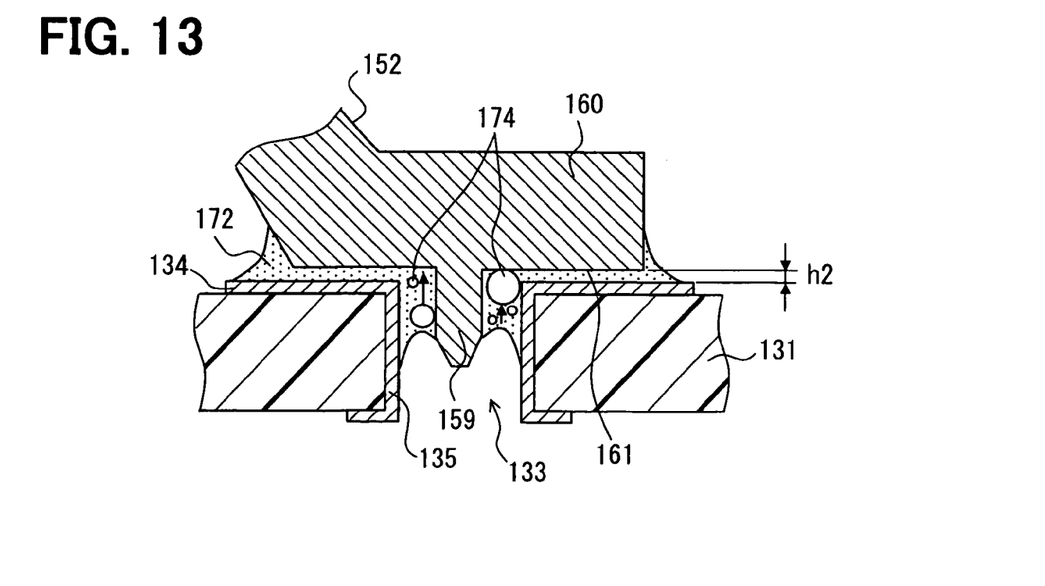
FIG. 13 is a cross-sectional view illustrating movements of bubbles in a coupling portion of a terminal with a printed circuit board according to a comparative example.
Figure 14:
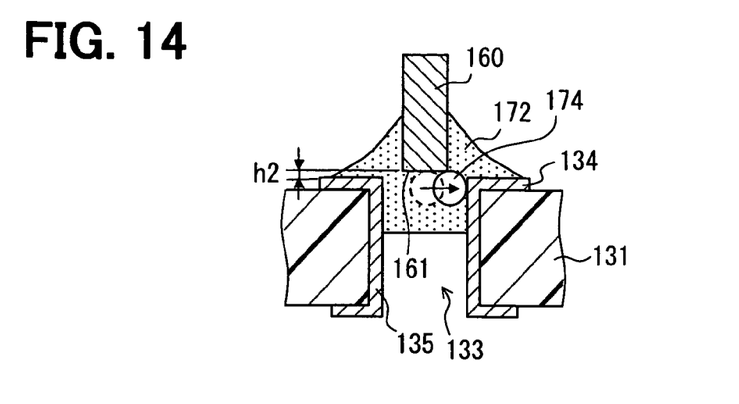
FIG. 14 is a cross-sectional view illustrating a movement of a bubble in the coupling portion of the terminal with the printed circuit board according to the comparative example.

A terminal 152 according to a comparative example will now be described with reference to FIG. 13 and FIG. 14. The terminal 152 is a branch terminal including an insertion section 159 and a surface section 160. The surface section 160 is coupled with a surface land 134 disposed on an upper surface of the printed circuit board 131 through a solder 172. The printed circuit board 131 has a through hole 133, and the insertion section 159 is coupled with an insertion land 135 in the through hole 133 through the solder 172. The surface section 160 does not have a recess part at a lower surface 161 thereof. The lower surface 161 is substantially flat and is away from a surface of the surface land 134 at the distance h2. Thus, a clearance between the lower surface 161 of the surface section 160 and the surface of surface land 134 is smaller than the clearance between the bottom surface 62a of the recess part 62 and the surface of the surface land 34. When the printed circuit board 131 is treated with the reflow process, bubbles 174 move upward in a melted solder 172 and contact the lower surface 161. Then, the bubbles 174 move in the direction perpendicular to the thickness direction of the printed circuit board 131, i.e., in the horizontal direction. However, the bubbles 174 larger than the clearance between the lower surface 161 of the surface section 160 and the surface of surface land 134 contact a sidewall of the through hole 133 while contacting the lower surface 161. Thus, the bubbles 174 are difficult to be released to an outside of the solder 172.

As described above, in the electronic control device 100, the recess parts 62 are provided at the lower surfaces 61 of the surface sections 60 of the terminals 52 so that the bubbles 74 can be effectively released from the melted solder 72 through the recess parts 62 as the introducing passages. Thereby, the amount of bubbles 74 that are released from the solder 72 at the reflow process increases. In addition, the maximum dimension of the bubbles 74 that can be removed from the solder 72 increases. As a result, when the solder 72 is cooled and solidified after the reflow process, the number of void generated due to the bubbles 74 can be reduced. Thus, the connectivity of the connector 50 with the printed circuit board 31 can be removed. Even when a part of the bubbles 74 cannot be released from the melted solder 72 through the recess parts 62 and remains in the melted solder 72, the amount of bubbles 74 remaining in the through holes 33 can be reduced. Thus, the connectivity of the connector 50 with the printed circuit board 31 can be improved.

The recess parts 62 extend to the both edges of the lower surfaces 61 in the arranging direction of the terminals 52, i.e., in the direction perpendicular to the longitudinal direction of the surface sections 60. Thus, the introducing passage of the bubbles 74 provided by the recess parts 62 become short, and the amount of bubbles 74 released from the solder 72 at the reflow process increases. However, the extending direction of the recess parts 62 is not limited to the arranging direction of the terminals 52 as long as the recess parts 62 extend to at least one edge of the lower surface 61. For example, the recess parts 62 may extend in the longitudinal direction of the surface section 60.

Figure 15:
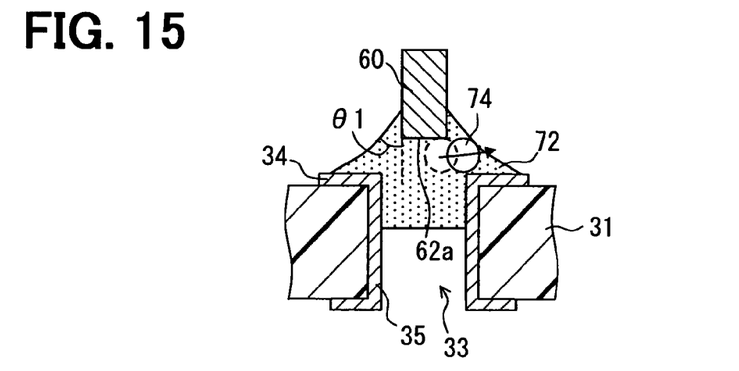
FIG. 15 is a cross-sectional view illustrating a movement of a bubble in a coupling portion of a terminal with a printed circuit board according to a first modification of the first embodiment.

In addition, the surface section 60 has the thin-wall region 63 and the thick-wall region 64. The thickness of the thin-wall region 63 is less than the thickness of the thick-wall region 64 in the arranging direction of the terminals. Thereby, the introducing passages of the bubbles 74 provided by the recess parts 62 become short, and the amount of bubbles 74 released from the solder 72 further increases. Thus, the connectivity of the connector 50 with the printed circuit board 31 can be improved. Furthermore, the thin-wall region 63 has a predetermined height. Thus, when the thin-wall region 63 is formed by hitting the punched terminals, the thickness of the thin-wall region 63 can be controlled easily. When the thickness of the insertion sections 59 is also less than the thick-wall region 64, the thickness of the thin-wall region 63 and the thickness of the insertion sections 59 can be controlled easily. Alternatively, the thickness of the surface section 60 may be substantially constant in a direction toward the upper surface of the printed circuit board 31, as illustrated in FIG. 15. Also in the present case, the clearances between the bottom surfaces 62a of the recess parts 62 and the upper surface of the printed circuit board 31 is large. Thus, the amount of the bubbles 74 and the maximum dimension of the bubbles 74 which can be released from the solder 72 increase compared with a case where the recess parts 62 are not provided at the lower surfaces 61 of the surface sections 60. When the surface section 60 has the thin-wall region 63, an angle between the surface section 60 and a surface of the side fillet is the sum of angle θ1 and angle θ2, as illustrated in FIG. 12. However, when the thickness of the surface section 60 is substantially constant, the angle between the surface section 60 and a surface of the side fillet becomes angle θ1, as illustrated in FIG. 15. Thus, when the thickness of the surface section 60 is substantially constant, the thickness of the side fillet is reduced.

Figure 16:
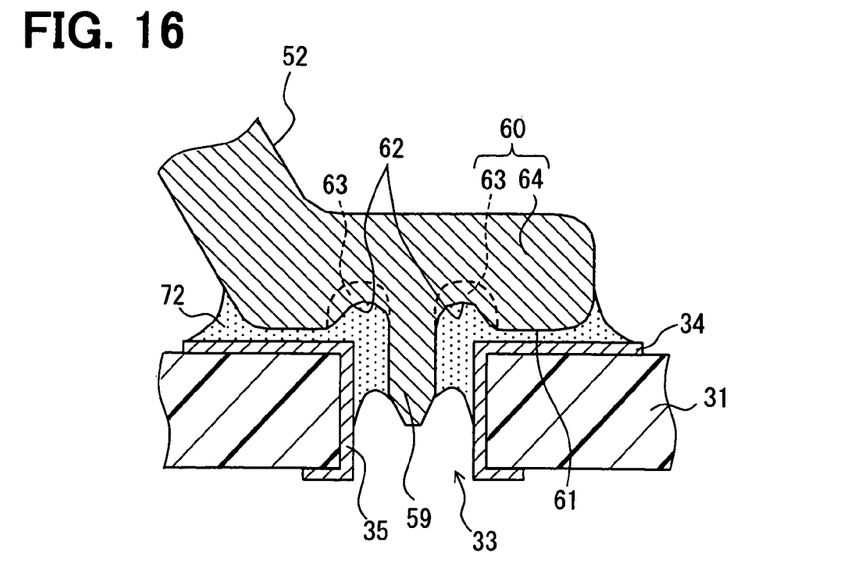
FIG. 16 is a cross-sectional view illustrating a coupling portion of a terminal with a printed circuit board according to a second modification of the first embodiment.
Figure 17:
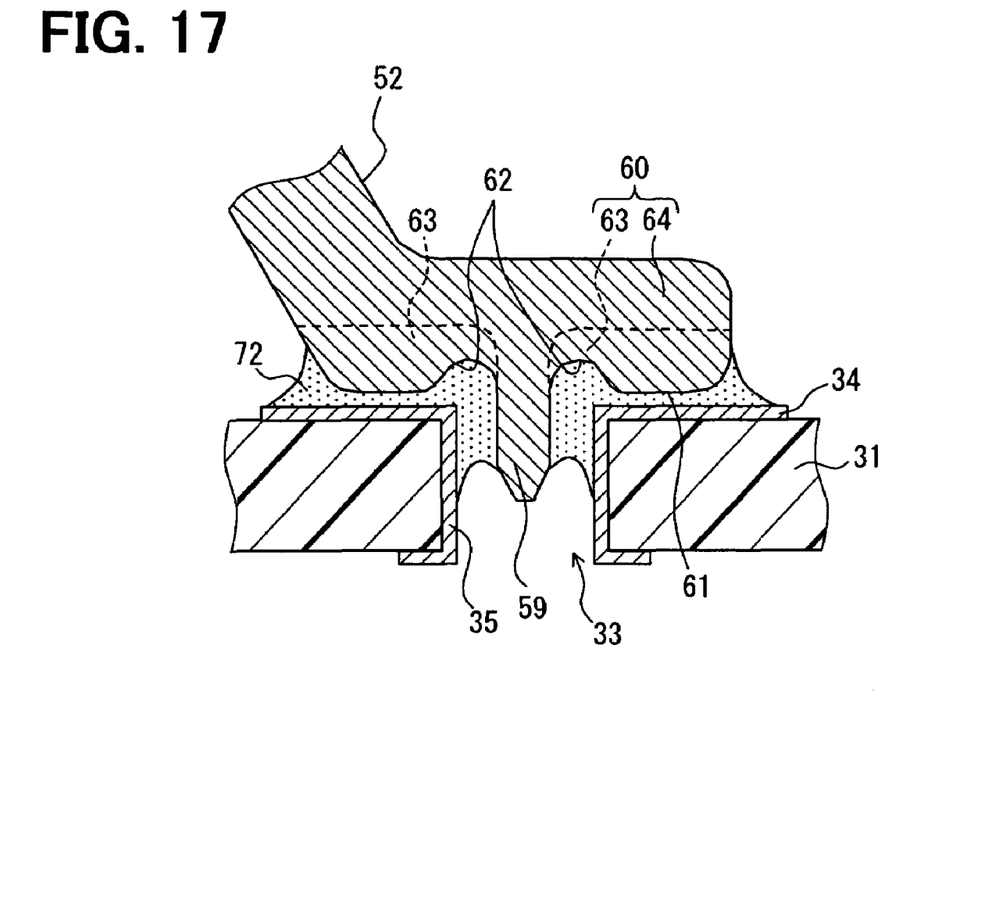
FIG. 17 is a cross-sectional view illustrating a coupling portion of a terminal with a printed circuit board according to a third modification of the first embodiment.

Alternatively, as illustrated in FIG. 16, only the peripheries around the recess parts 62, i.e., only the portions surrounded by the dashed line may be the thin-wall region 63 and the other portion of the surface section 60 may be the thick-wall region 64. In the present case, the introducing passages of the bubbles 74 become short and the rigidity of the surface section 60 becomes large. In addition, because the thickness of the insertion section 59 is larger than the thickness of the thin-wall region 63, the rigidity of the insertion section 59 is ensured. Thus, when the insertion section 59 is inserted into the through hole 33, the insertion section 59 is restricted from bending by contacting the printed circuit board 31. In addition, a variation in position of the insertion section 59 with respect to the through hole 33, that is variation in clearance between the wall of through hole 33 and the insertion section 59 is reduced. As a result, the bubbles 74 can move to the upper-surface side of the printed circuit board 31. Alternatively, as illustrated in FIG. 17, the thickness of the insertion section 59 is not reduced and a region of the surface section 60 including the peripheries around the recess part 62, i.e., the portion surrounded by the dashed line may be the thin-wall region 63.

Furthermore, in the present embodiment, the recess parts 62 are provided adjacent to the branch portion of the insertion section 59. Because frontages of the recess parts 62 located over the through hole 33 are large, the maximum dimension of bubbles 74 that can be introduced in the recess parts 62 increases. As a result, the connectivity of the connector 50 with the printed circuit board 31 can be improved. However, the position of the recess parts 62 is not limited to the branch portion of the insertion section 59. For example, a flat surface may remain at the lower surface 61 between the branch portion of the insertion section 59 and the recess parts 62.

In addition, the recess parts 62 are rounded and do not have any angular portion. Thus, the bubbles 74 are difficult to be caught in the recess parts 62 and the bubbles 74 can be effectively released to the outside of the solder 72. However, the shape of the recess parts 62 is not limited to a rounded shape. Alternatively, the recess parts 62 may have corner portions.

The solder 72 disposed in the recess parts 62 function as anchors. Thus, the connectivity of the connector 50 with the printed circuit board 31 in the direction perpendicular to the extending direction of the through holes 33, i.e., in the horizontal direction can be improved.

In addition, the portion of the lower surfaces 61 other than the recess parts is substantially flat and is closer to the surface of the surface land 34 than the recess parts 62 are. Thus, the amount of the solder 72 for ensuring the connectivity can be reduced. That is, the side fillets become large and the connectivity can be improved.

Figure 18:
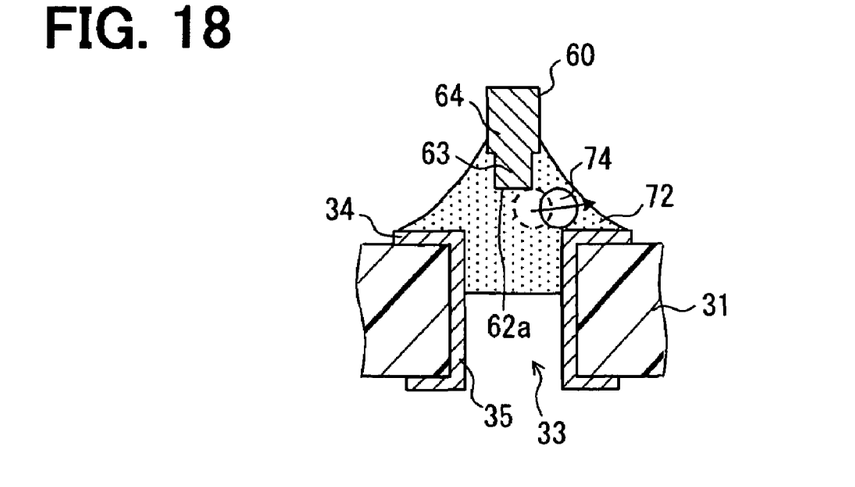
FIG. 18 is a cross-sectional view illustrating a movement of a bubble in a coupling portion of a terminal with a printed circuit board according to a fourth modification of the first embodiment.

The thin-wall region 63 has the taper shape in which the thickness decreases toward the upper surface of the printed circuit board 31. Thus, as illustrated in FIG. 12, the thickness of the side fillets of the solder 72 formed at taper surfaces 63a of the thin-wall region 63 can be large. In the present case, the thickness of the side fillet increases by a thickness corresponding to the angle θ2 between an a line extended from a side surface of the thick-wall region 64 and the taper surface 63a in addition to a thickness corresponding to the angle θ1 between the surface of the side fillet and the line extended from the side surface of the thick-wall region 64. Thus, the connectivity of the connector 50 with the printed circuit board 31 can be improved. Alternatively, as illustrated in FIG. 18, the thickness of the thin-wall region 63 may be substantially constant and the thin-wall region 63 and the thick-wall region 64 may provide a stepped portion at a boundary of the thin-wall region 63 and the thick-wall region 64. In the present case, the thickness of the thin-wall region 63 can be controlled easily. Especially, when the side fillets of the solder 72 are provided to the thick-wall region side, the thickness of the side fillets increases by a thickness corresponding to the stepped portion in addition to the thickness corresponding to the angle θ1.

Furthermore, in the present embodiment, the corner portions 65 of the lower surface 61 and the side surfaces of the surface section 60 are rounded. The side fillets of the solder 72 are formed at the side surfaces of the surface section 60 including the corner portions 65. Thus, the thickness of the side fillets of the solder 72 increases compared with a case where the corner portions 65 are not rounded. Thereby, the connectivity of the corner portions 65 of the surface section 60 and the solder 72 can be improved. However, the corner portions 65 may be angulated.

A cross-sectional area of the through hole 33 may be increased from the lower-surface side of the printed circuit board 31 toward the upper-surface side of the printed circuit board 31. In the present case, a distance between the insertion section 59 and the sidewall of the through hole 33 increases, and thereby the bubbles 74 can be effectively released from the through hole 33. However, because the through hole 33 has a complicated shape, the production cost may increase. In addition, because the cross-sectional area of the through hole 33 on the upper-surface side of the printed circuit board 31 increases, a dimension of the printed circuit board 31 increases. Thus, when the terminal 52 having the recess parts 62 is used, the bubbles 74 can be released more effectively compared with a case where the cross-sectional area of the through hole 33 is increased toward the upper-surface side of the printed circuit board 31.

Second Embodiment

A terminal 52 disposed in an electronic control device according to a second embodiment of the invention will be described with reference to FIG. 19.

Because the present electronic control device has many portions in common with the electronic control device 100 illustrated in FIG. 1, a description of the common portions will be omitted and different portions will be mainly described. Also in the present embodiment, the second terminal 52b will be described as the terminal 52.

The present terminal 52 has the lower surface 61 that faces the surface land 34, and two protruding parts 66 are disposed at the lower surface 61. The protruding parts 66 are disposed on opposite sides of the insertion section 59. Between the protruding parts 66 and the insertion section 59, recess parts 62 are provided respectively.

The distance between the bottom surfaces 62a of the recess parts 62 and the upper surface of the printed circuit board 31 can be controlled with a height of the protruding parts 66. Also in the present electronic control device, the bubbles 74 can be effectively released from the solder through the recess parts 62.

The protruding parts 66 function as anchors to the solder 72. Thus, the connectivity of the terminal 52 with the solder 72 increases.

Because the protruding parts 66 are configured to be spacers, a shape and an arrangement of the protruding part 66 are not limited as long as a introducing passage of the bubbles 74 is provided. For example, the protruding parts 66 may extend to both edges of the lower surface 61 in the arranging direction of the terminals 52. Alternatively, the protruding parts 66 may not extend to the both edge of the lower surface 61. For example, a plurality of protruding parts 66 may be disposed on one side of the insertion section 59 in the longitudinal direction of the surface section 60.

Figure 19:
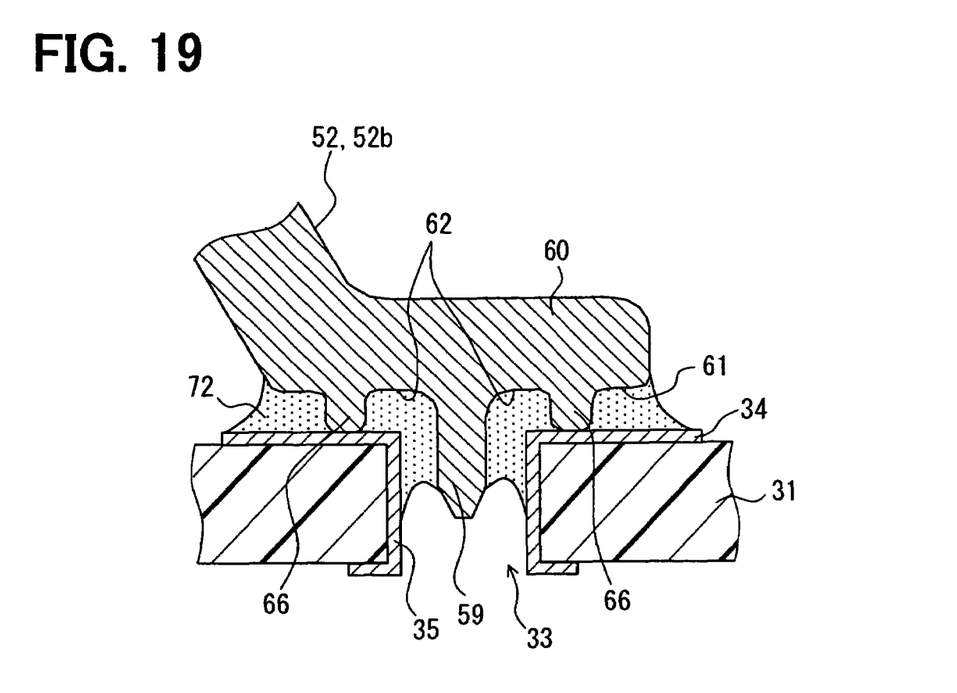
FIG. 19 is a cross-sectional view illustrating a coupling portion of a terminal with a printed circuit board according to a second embodiment.

In FIG. 19, the protruding parts 66 contact the surface land 34. Alternatively, the protruding parts 66 may be separated from the surface land 34 through the solder 72.

Instead of the terminal 52, the surface land 34 may have protruding parts. However, in a case where the protruding parts 66 are disposed at the terminals 52, especially, when the terminals 52 is provided by punching, the production cost can be reduced compared with a case where the protruding parts are provided at the surface land 34.

Third Embodiment

A terminal 52 disposed in an electronic control device according to a third embodiment of the invention will be described with reference to FIG. 20.

Because the present electronic control device has many portions in common with the electronic control device 100 illustrated in FIG. 1, a description of the common portions will be omitted and different portions will be mainly described. Also in the present embodiment, the second terminal 52b will be described as the terminal 52.

The present surface section 60 has two exhaust holes 67 that function as introducing passages of the bubbles 74. Each exhaust hole 67 extends from the lower surface 61 of the surface section 60 to another surface of the surface section 60. An opening part of each exhaust hole 67 on the lower-surface side is provided in such a manner that a portion of the opening part is located over a portion of the through hole 33. For example, the exhaust holes 67 extend from the lower surface 61 to the upper surface of the surface section 60.

In the present case, the bubbles 74 can be effectively released to the outside of the solder 72 through the exhaust holes 67. Thereby, the number of void can be reduced, and the connectivity of the connector 50 with the printed circuit board 31 can be improved.

In addition, because the solder 72 in the exhaust holes 67 functions as anchor, the connectivity of the connector 50 with the printed circuit board 31 can be improved in the direction perpendicular to the extending direction of the through hole 33, i.e., in the horizontal direction.

When the exhaust holes 67 extend from the lower surface 61 to the upper surface of the surface section 60, the exhaust holes 67 can be provided easily. Thus, the exhaust holes 67 can be provided at a low cost. Furthermore, the bubbles 74 that move upward can be effectively released to the outside of the solder 72.

The present terminal 52 is difficult to be formed only by punching. Thus, after the branch structure of the terminal 52 is formed by bending or punching, the exhaust holes 67 are provided by an additional process, for example, by irradiating a laser beam.

Figure 20:
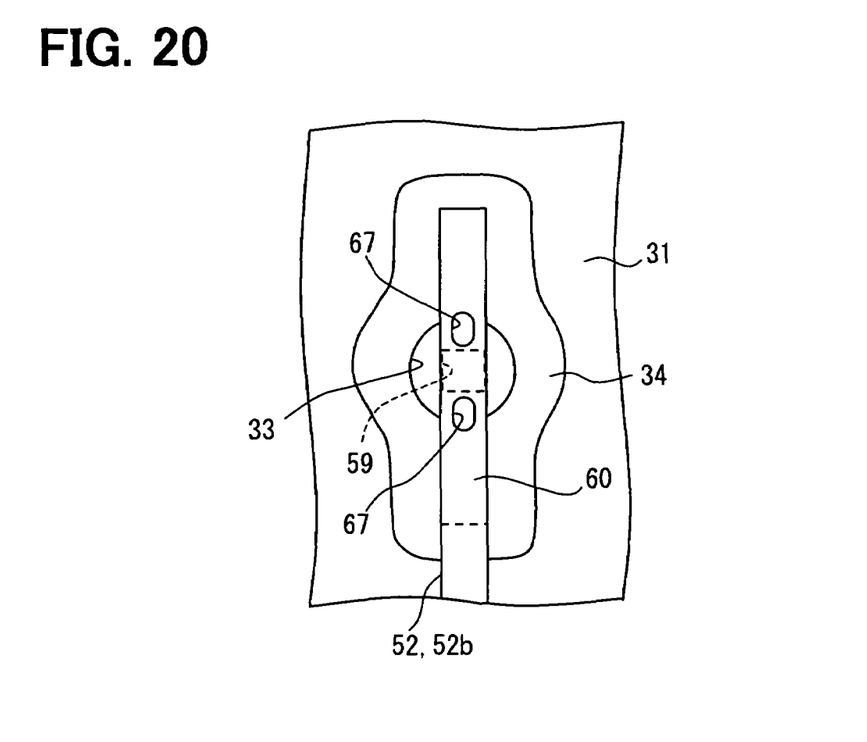
FIG. 20 is a plan view illustrating a coupling portion of a terminal with a printed circuit board according to a third embodiment.

In FIG. 20, the two exhaust holes 67 are provided at the surface section 60 to be located on opposite sides of the insertion section 59. However, the number of the exhaust holes 67 may be changed. Alternatively, the surface section 60 may have a cut portion for reducing a width of the surface section in the arranging direction of the terminals 52. In the present case, the bubbles 74 can be released to the outside of the solder 72 from the cut portion. That is, when the area of the surface section 60 located over the through hole 33 is reduced, the bubbles 74 can be effectively released to the outside of the solder 72.

Other Embodiments

Although the present invention has been fully described in connection with the exemplary embodiments thereof with reference to the accompanying drawings, it is to be noted that various changes and modifications will become apparent to those skilled in the art.

In the above-described embodiments, each terminal 52 has an approximately T-shape, as an example. Each terminal 52 including the insertion section 59 and the surface section 60 may have various shapes without being limited to the above example. For example, each terminal 52 may have an inverted L-shape. When each terminal 52 has the approximately T-shape, at least one of the recess part 62, the protruding parts 66 and the exhaust hole 67 may be provided at only one of the portions of the surface section 60 located on the opposite sides of the insertion section 59.

In the above-described embodiments, a portion of each recess part 62 and a portion of each exhaust hole 67 are located over the surface land 34. Alternatively, each recess part 62 and each exhaust hole 67 may be provided at least over a portion of the through hole 33.

In the above-described embodiments, all of the terminals 52 are the branch terminal, as an example. Alternatively, at least a part of the terminals 52 may be the branch terminal.

In the above-described embodiments, the terminals 52 include the first terminals 52a, the second terminals 52b, and the third terminals 52c, as an example. The type of the terminal 52 is not limited to the above-described example. For example, the terminals 52 may not include the third terminals 52c as the reinforcing terminals. The number, the type, and the arrangement of the terminal block are not limited to the above-described example.

The number of row and the arrangement of the terminals 52 in the housing 51 and the number of row and the arrangement of the surface lands 34 on the printed circuit board 31 are not limited to the above-described example.

In the above-described embodiments, the connector 50 is shown as an example of an electronic element having branch terminals. In addition, the electronic control device 100 that includes the printed circuit board 31 on which the connector 50 is mounted is shown as an example of an electronic device that includes a printed circuit board on which the electronic element is mounted. However, the electronic element is not limited to the connector 50 as long as the electronic element has a body and a plurality of terminals extending from the body. For example, the terminals 52 may be disposed at other electronic element 32, for example, the microcomputer.

In the above-described embodiments, end portions of the terminals 52 (i.e., electronic element) coupled with the circuit board 30 extend from one surface of the housing 51, as an example. Alternatively, the end portions of the terminals 52 coupled with the circuit board 30 may extend from a plurality of surfaces of the housing 51.

In the above-described embodiments, the electronic control device 100 has a waterproof structure. Alternatively, the electronic control device 100 may have a non-waterproof structure.

In the above-described embodiments, the insertion sections 59 do not protrude from the lower surface of the printed circuit board 31 and the solder 72 is provided only at regions where the insertion sections 59 face the sidewall of the through holes 33. However, the length of the insertion sections 59 and the arranging region of the solder 72 in the through hole 33 are not limited to the above example. For example, the end portions of the insertion sections 59 may protrude to the lower-surface side of the printed circuit board 31. Alternatively, the solder 72 may be disposed in the through holes 33 to the lower-surface side. Alternatively, the solder 72 may be disposed in the through holes 33 from the upper-surface side of the printed circuit board 31 to portions of the through holes 33.

In the example illustrated in FIG. 6, the through hole 33 is positioned at a center portion of the surface land 34, and a width of the surface land 34 in the arranging direction of the terminals 52 expands in the vicinity of the through hole 33. However, the relative position and the relative dimension of the surface land 34 and the through hole 33 are not limited to the above example. For example, the through holes 33 may be out of the center portions of the surface lands 34 in a manner similar to the surface lands 34 for the first terminals 52a illustrated in FIG. 5. Alternatively, the surface lands 34 may have approximately rectangular shapes.

Such changes and modifications are to be understood as being within the scope of the present invention as defined by the appended claims.

What is claimed is:

1. An electronic device comprising:
   a printed circuit board that has a first surface and a second surface and that includes a plurality of lands; and
   an electronic element that has a body and a plurality of terminals extending from the body, wherein:
   the electronic element is disposed on the first surface of the printed circuit board in such a manner that the plurality of terminals is arranged on the first surface in a predetermined direction;

the plurality of terminals is coupled with the plurality of lands respectively;

the printed circuit board further has a through hole extending from the first surface to the second surface;

one of the plurality of lands includes a surface land disposed on the first surface of the printed circuit board and an insertion land integrally disposed on a sidewall of the through hole and on a periphery around the through hole;

one of the plurality of terminals includes a surface section and an insertion section;

the surface section is disposed on the surface land in such a manner that an attaching surface of the surface section faces the surface land, and the surface section is coupled with the surface land through a solder;

the insertion section is disposed in the through hole and is coupled with the insertion land through the solder;

the surface section has a recess part on the attaching-surface side; and a portion of recess part is disposed so as to be axially aligned with a portion of the through hole.

2. The electronic device according to claim 1, wherein the attaching surface of the surface section is substantially flat except for a portion where the recess part is disposed.

3. The electronic device according to claim 2, wherein:
the insertion section branches from a portion of the attaching surface of the surface section; and
the recess part is disposed adjacent to the branch portion.

4. The electronic device according to claim 1, wherein:
the surface section has a protruding part on the attaching surface;
the insertion section branches from a portion of the attaching surface; and
the recess part is defined by the protruding part, the insertion section, and a portion of the attaching surface between the protruding part and the insertion section.

5. The electronic device according to claim 1, wherein the recess part has a rounded shape.

6. The electronic device according to claim 1, wherein the recess part extends to at least one edge of the attaching surface in the predetermined direction.

7. The electronic device according to claim 6, wherein:
the surface section includes a first region and a second region;
the first region includes a periphery around the recess part;
the first region has a first thickness in the predetermined direction;
the second region has a second thickness in the predetermined direction; and
the first thickness is less than the second thickness.

8. The electronic device according to claim 7, wherein the first region is a region from the attaching surface and a predetermined distance from the attaching surface.

9. The electronic device according to claim 7, wherein:
the insertion section has a thickness in the predetermined direction; and
the thickness of the insertion section is larger than the first thickness of the first region.

10. The electronic device according to claim 7, wherein the first thickness of the first region decreases toward the first surface of the printed circuit board.

11. The electronic device according to claim 7, wherein:
the first thickness of the first region is substantially constant in a direction toward the first surface of the printed circuit board; and
the first region and the second region provide a stepped portion at a boundary of the first region and the second region.

12. The electronic device according to claim 1, wherein the terminal that includes the surface section and the insertion section is formed by punching a plate.

13. The electronic device according to claim 1, wherein:
the electronic element is a connector;
each terminal has two end portions extending from the body;
one end portion of each terminal is electrically coupled with the corresponding land; and
the other end portion of each terminal is configured to be electrically coupled with an external connector.

14. An electronic device comprising:
a printed circuit board that has a first surface and a second surface and that includes a plurality of lands; and
an electronic element that has a body and a plurality of terminals extending from the body, wherein:
the electronic element is disposed on the first surface of the printed circuit board in such a manner that the plurality of terminals is arranged on the first surface in a predetermined direction;
the plurality of terminals is coupled with the plurality of lands respectively;
the printed circuit board further has a through hole extending from the first surface to the second surface;
one of the plurality of lands includes a surface land disposed on the first surface of the printed circuit board and an insertion land integrally disposed on a sidewall of the through hole and on a periphery around the through hole;
one of the plurality of terminals includes a surface section and an insertion section;
the surface section is disposed on the surface land in such a manner that an attaching surface of the surface section faces the surface land, and the surface section is coupled with the surface land through a solder;
the insertion section is disposed in the through hole and is coupled with the insertion land through the solder;
the surface section has an exhaust hole that extends from the attaching surface to another surface of the surface section; and
an opening part of the exhaust hole on the attaching-surface side is provided in such a manner that a portion of the opening part is axially aligned with a portion of the through hole.

15. The electronic device according to claim 14, wherein:
the electronic element is a connector;
each terminal has two end portions extending from the body;
one end portion of each terminal is electrically coupled with the corresponding land; and
the other end portion of each terminal is configured to be electrically coupled with an external connector.

* * * * *